Figure 1:
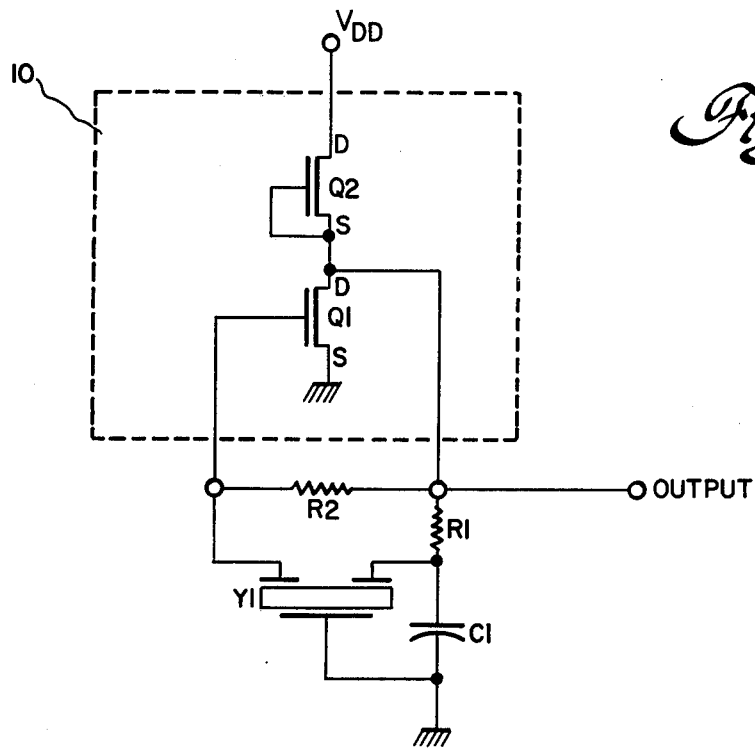

United States Patent [19]

Dobberpuhl

[11] 4,048,590

[45] Sept. 13, 1977

[54] INTEGRATED CRYSTAL OSCILLATOR CIRCUIT WITH FEW EXTERNAL COMPONENTS

[75] Inventor: Daniel W. Dobberpuhl, Liverpool, N.Y.

[73] Assignee: General Electric Company, Schenectady, N.Y.

[21] Appl. No.: 707,275

[22] Filed: July 21, 1976

[51] Int. Cl.$^2$ .............................................. H03B 5/36
[52] U.S. Cl. ................................ 331/116 R; 307/303; 330/38 M; 331/108 D
[58] Field of Search ........................... 307/303, 304; 331/108 C, 108 D, 116 R; 330/35, 38 M, 40

[56] References Cited

U.S. PATENT DOCUMENTS

| | | |
|---|---|---|
| 3,792,377 | 2/1974 | Fujita et al. ...................... 331/116 R |
| 3,832,644 | 8/1974 | Nagata et al. ...................... 330/35 X |
| 3,959,744 | 5/1976 | O'Connor ......................... 331/116 R |

*Primary Examiner*—Siegfried H. Grimm
*Attorney, Agent, or Firm*—Jerome C. Squillaro; Joseph T. Cohen; Julius J. Zaskalicky

[57] ABSTRACT

A semiconductor integrated oscillator circuit requiring higher impedances than are practical by integrated circuit technology and generally provided by discrete components external to the circuit are functionally provided in the integrated circuit by a "current mirror" circuit which provides the bias function separate from the signal function.

4 Claims, 2 Drawing Figures

INTEGRATED CRYSTAL OSCILLATOR CIRCUIT WITH FEW EXTERNAL COMPONENTS

The present invention relates to semiconductor integrated circuits and more particularly to a metal-oxide semiconductor crystal oscillator circuit with as few external components as possible.

Most digital processing systems utilizing metal-oxide-semiconductor large scale integration (MOS/LSI) require an accurate time base for controlling logic functions. Generally this is accomplished with a master oscillator circuit incorporating a frequency determining element, such as a quartz crystal of either the piezoelectric type or of the turning fork type. Obviously, where MOS/LSI is employed, it is always desirable to keep the total number of discrete components external thereto to as small a number as possible. Unfortunately, the ability to fabricate certain types of electrical components is integrated circuit form are limited by the integrated circuit technology. For example, it is well known that the fabrication of resistors of 100 kiloohms or more are exceedingly difficult and generally impractical to fabricate in integrated circuit form. Accordingly, where circuit design necessitates the use of such elements, discrete components external to the integrated circuit are generally utilized. In view of the increased number of connections and additional costs occasioned by the use of external components, it is highly desirable to integrate as many components as possible if at all practical.

It is therefore an object of this invention to integrate a MOS crystal oscillator circuit with as few external components as possible.

It is a further object of this invention to provide a semiconductor integrated oscillator circuit including biasing means separate and independent from the oscillating element.

Briefly, these and other objects are achieved in accordance with one embodiment of my invention wherein first and second current paths are electrically connected in parallel with a voltage source and wherein the first current path includes a current limiting means serially connected with an active oscillatory device and the second current path includes a pair serially connected current limiting devices. Bias means is provided between the nodal point of the second current path and the active device for biasing the active device without adversely affecting the negative feedback path of the active device. The resulting oscillator circuit includes only an external frequency controlling element, such as a quartz crystal and, a capacitor.

Figure 2:
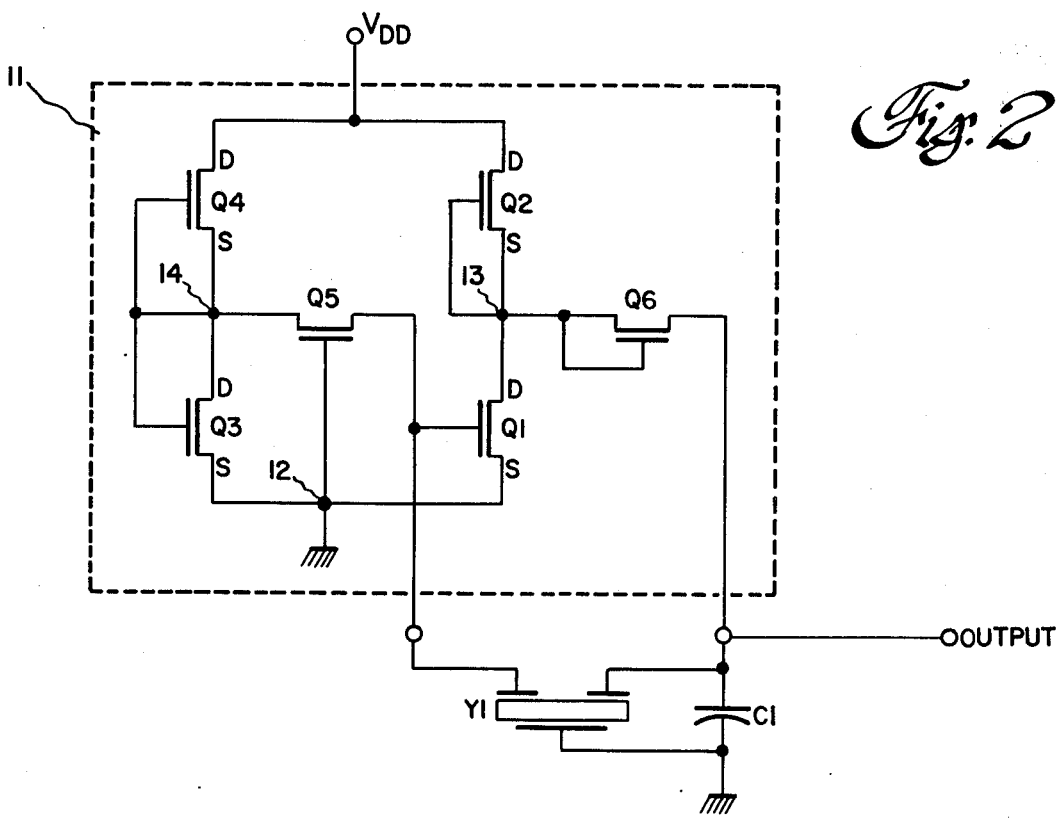

The novel features believed characteristic of the invention are set forth in the appended claims. The invention itself, together with other objects and advantages thereof, may best be understood by reference to the following detailed description taken in conjunction with the accompanying drawings in which:

FIG. 1 is an electrical schematic diagram of an oscillator circuit constructed in accordance with the prior art; and FIG. 2 is an electrical schematic diagram of an oscillator circuit constructed in accordance with an embodiment of the present invention.

FIG. 1 is illustrative of an oscillator circuit of prior art design. Specifically, FIG. 1 illustrates a portion of a large-scale integration (LSI) semiconductor wafer 10 including metal-oxide-semiconductor (MOS) insulated gate field effect transistors Q1 and Q2 serially connected to a voltage source designated by $V_{DD}$. Transistor Q1 is typically an enhancement mode device whereas Q2 is a depletion mode device. As connected, Q2 functions as the active load impedance for the transistor Q1. The drain terminal of transistor Q1 is connected to a phase shift network comprising resistor R1 and capacitor C1 which are discrete devices external to the wafer 10. Resistor R1 provides current limiting for the frequency controlling element Y1, illustrated as a tuning fork-type quartz crystal. Obviously, those skilled in the art can readily appreciate that other frequency determining elements may be employed where desired or necessary. Typically, resistor R1 is approximately 500 kilo ohms. Resistor R2, on the other hand, connected between the drain and gate electrodes of transistor Q1 provides a DC bias for the active oscillator transistor, Q1. Because resistor R2 is connected between the drain and gate electrodes, it represents a negative feedback element which can limit the gain of the oscillator transistor Q1 unless the value thereof is very large. Typically, resistor R2 is on the order of 20 megohms or more. Since the transistor Q1 draws substantially no gate current, such a high value for resistor R2 is adequate to provide the necessary DC bias.

The operation of the oscillator circuit illustrated in FIG. 1 is typical of most crystal control oscillators; namely, the phase shift between drain and gate necessary to sustain oscillation occurs only at the frequency determined by the frequency controlling element Y1. At all other frequencies, the phase shift is inadequate to sustain oscillation and hence the output signal from the oscillator circuit is substantially a sine wave at the frequency determined by Y1. Capacitor C1 in conjunction with resistor R1 permits small changes in phase shift which permit "fine tuning" of the oscillator output frequency.

While the oscillator circuit illustrated in FIG. 1 provides an accurate time base for most applications, it is desirable from a cost and reliability standpoint to minimize the number of components externally connected to the integrated circuit. As pointed out above, however, the integration of resistive elements of greater than approximately 100 kiloohms are exceedingly difficult to fabricate and require substantial amounts of surface area on the chip to provide such functions. Generally, such resistive elements are fabricated by parallel or serial connection of a multitude of resistors (e.g., 100 kiloohms) until the desired value resistance is obtained.

FIG. 2 illustrates an embodiment of my invention wherein the disadvantages pointed out above with respect to the prior art circuit of FIG. 1 are obviated. Specifically, FIG. 2 illustrates a portion of an LSI 11 including MOS transistors Q1 and Q2 serially connected to a voltage source $V_{DD}$ and a reference potential, illustrated by the ground connection at point 12. The serial connection of Q1 and Q2 represents a first current path in which the transistor Q2 functions as a load device and Q1 as an active oscillatory device. The connection between Q1 and Q2 is designated as a first nodal point 13. Transistors Q3 and Q4 are also serially connected and represent a second current path electrically connected in parallel relationship with the first current path. The connection between Q3 and Q4 is illustrated as a second nodal point 14. In accordance with this embodiment of my invention, transistors Q1 and Q3 are enhancement mode devices and transistors Q2 and Q4 as well as transistors Q5 and Q6 are depletion mode devices.

The second current path comprising transistors Q3 and Q4 provide a "current mirror circuit" which provides a bias voltage at the nodal point 14 substantially identical to that at the nodal point 13. As a result, the bias voltage required at the gate of transistor Q1 can now be provided from the nodal point 14 through transistor Q5 separately and independently of the first current path. Those skilled in the art can readily appreciate that the current mirror circuit comprising transistors Q3, Q4 and Q5 provide substantially the same electrical function as that provided by the resistor R2 except that the impedance between the drain and gate of Q1 is now substantially infinite whereas in FIG. 1 this impedance was limited to the value of resistor R2.

In further accordance with my invention, FIG. 2 illustrates the use of transistor Q6 operatively connected as a current-limiting element and serially connected between the nodal point 13 and the external capacitor C1. Essentially, the transistor Q6 performs the function of resistor R1 of FIG. 1. FIG. 2 also illustrates the frequency-determining element Y1 connected in substantially the same manner as FIG. 1.

Those skilled in the art can readily appreciate that the embodiment of my invention illustrated in FIG. 2 performs substantially the same function illustrated in FIG. 1 while obviating the disadvantages thereof.

Although the invention has been described with reference to a specific embodiment, it should be obvious to those skilled in the art that various modifications may be made without departing from the true spirit and scope of the invention.

What I claim as new and desire to secure by Letters Patent of the United States is:

1. A semiconductor integrated circuit comprising:
   a current path including a first current limiting device serially connected with an active device, the connection between said devices being a nodal point;
   a current mirror circuit connected in electrical parallel relationship with said current path for providing a bias voltage to said active device separately and independently of said current path, said current mirror circuit including second and third current limiting devices serially connected together, the connection therebetween being another nodal point, which other nodal point provides the bias voltage substantially identical to the bias voltage at said one nodal point;
   a frequency controlling element operatively connected to said active device for causing said active device to oscillate at a frequency determined by said frequency controlling element; and
   a transistor connected to said other nodal point and said active device for providing said bias voltage to said active device.

2. The integrated circuit of claim 1 further comprising:
   a fourth current limiting device connected to said active device and said frequency controlling element to limit the current flow therethrough.

3. The integrated circuit of claim 2 wherein said current limiting devices, said active device and said transistor are insulated gate field effect transistors.

4. The integrated circuit of claim 2 wherein said active device and said third current limiting device are enhancement-mode transistors and said other devices are depletion-mode transistors.

* * * * *